United States Patent
Chang et al.

(10) Patent No.: US 9,887,134 B2
(45) Date of Patent: Feb. 6, 2018

(54) SEMICONDUCTOR DEVICES, METHODS OF MANUFACTURE THEREOF, AND METHODS OF SINGULATING SEMICONDUCTOR DEVICES

(71) Applicant: Taiwan Semiconductor Manufacturing Company, Ltd., Hsin-Chu (TW)

(72) Inventors: Yao-Wen Chang, Taipei (TW); Jian-Shiou Huang, Fangliao Township (TW); Cheng-Yuan Tsai, Chu-Pei (TW); Kong-Beng Thei, Pao-Shan Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/170,390

(22) Filed: Jun. 1, 2016

(65) Prior Publication Data
US 2017/0229346 A1 Aug. 10, 2017

Related U.S. Application Data

(60) Provisional application No. 62/293,409, filed on Feb. 10, 2016.

(51) Int. Cl.
*H01L 21/78* (2006.01)
*H01L 21/683* (2006.01)
(Continued)

(52) U.S. Cl.
CPC .......... *H01L 21/78* (2013.01); *H01L 21/0228* (2013.01); *H01L 21/02178* (2013.01);
(Continued)

(58) Field of Classification Search
CPC ... H01L 23/291; H01L 23/3171; H01L 24/03; H01L 21/6835; H01L 21/76895;
(Continued)

(56) References Cited

U.S. PATENT DOCUMENTS

| | | | |
|---|---|---|---|
| 7,528,010 B2* | 5/2009 | Otremba | H01L 21/78 438/106 |
| 8,791,015 B2* | 7/2014 | Pagaila | H01L 23/552 257/660 |
| 2014/0091455 A1* | 4/2014 | Strothmann | H01L 23/3114 257/734 |

* cited by examiner

*Primary Examiner* — Luan C Thai
(74) *Attorney, Agent, or Firm* — Slater Matsil, LLP

(57) ABSTRACT

Semiconductor devices, methods of manufacture thereof, and methods of singulating semiconductor devices are disclosed. In some embodiments, a method of manufacturing a semiconductor device includes forming a trench in a substrate, the trench being formed within a first side of the substrate and disposed around a portion of the substrate. A first insulating material is formed over the first side of the substrate and the trench, and a second insulating material is formed over the first insulating material. Apertures are formed in the second insulating material and the first insulating material over the portion of the substrate. Features are formed in the apertures, and a carrier is coupled to the features and the second insulating material. A second side of the substrate is planarized, the second side of the substrate being opposite the first side of the substrate. The second insulating material is removed, and the carrier is removed.

20 Claims, 21 Drawing Sheets

(51) Int. Cl.
  *H01L 21/02*      (2006.01)
  *H01L 21/3105*    (2006.01)
  *H01L 21/768*     (2006.01)
  *H01L 23/29*      (2006.01)
  *H01L 23/31*      (2006.01)
  *H01L 23/00*      (2006.01)

(52) U.S. Cl.
  CPC .... *H01L 21/31053* (2013.01); *H01L 21/6835* (2013.01); *H01L 21/76895* (2013.01); *H01L 23/291* (2013.01); *H01L 23/3171* (2013.01); *H01L 24/03* (2013.01); *H01L 24/06* (2013.01); *H01L 2221/68327* (2013.01); *H01L 2924/05432* (2013.01); *H01L 2924/14* (2013.01)

(58) Field of Classification Search
  CPC ... H01L 21/78; H01L 24/06; H01L 21/02178; H01L 21/0228; H01L 21/31053
  USPC ........................................................ 438/465
  See application file for complete search history.

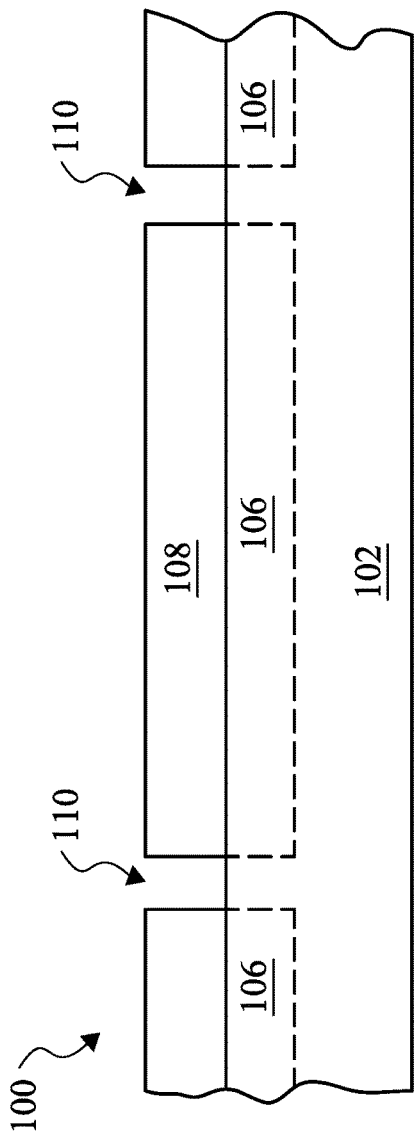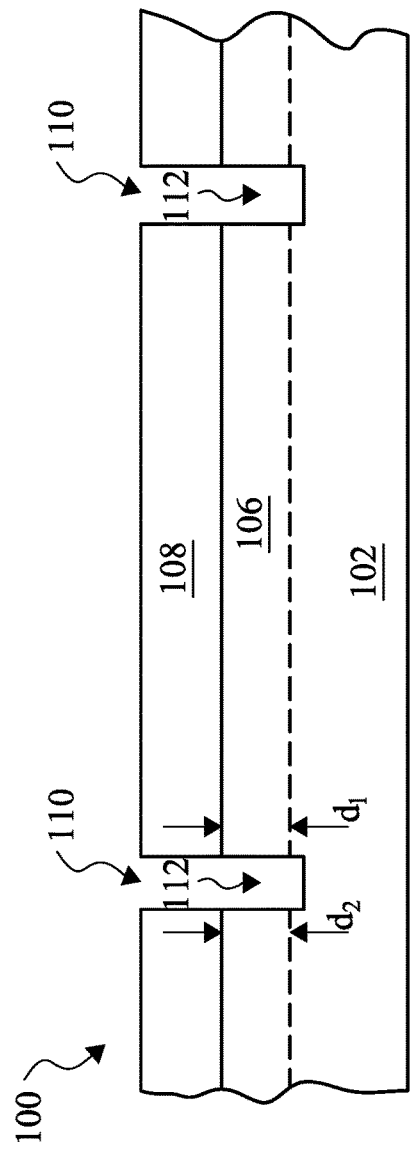

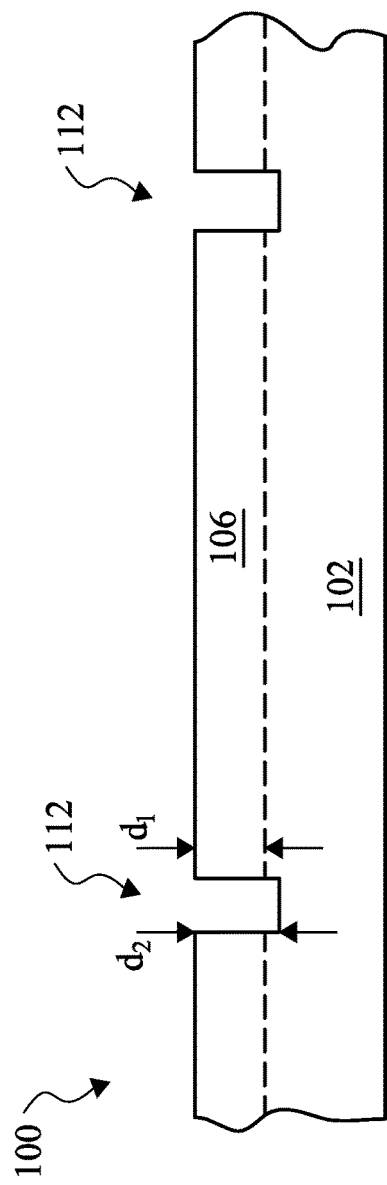
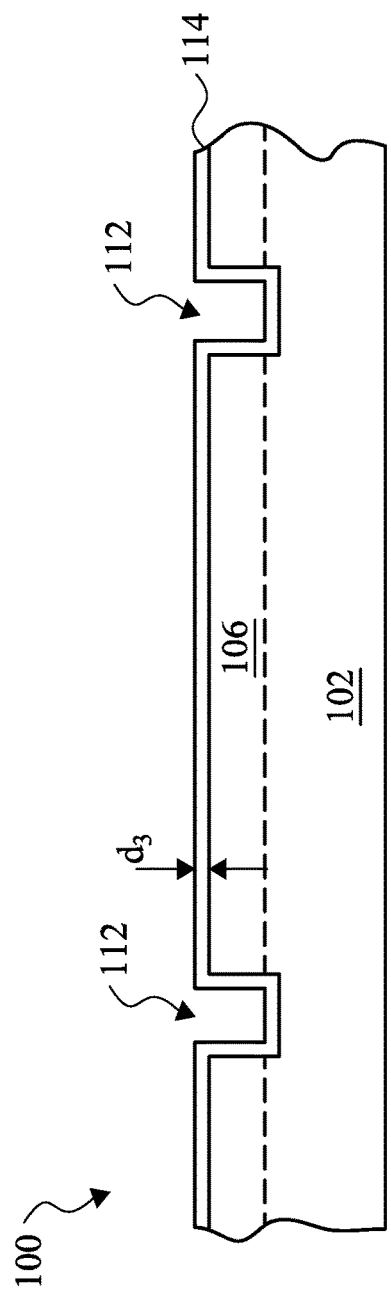

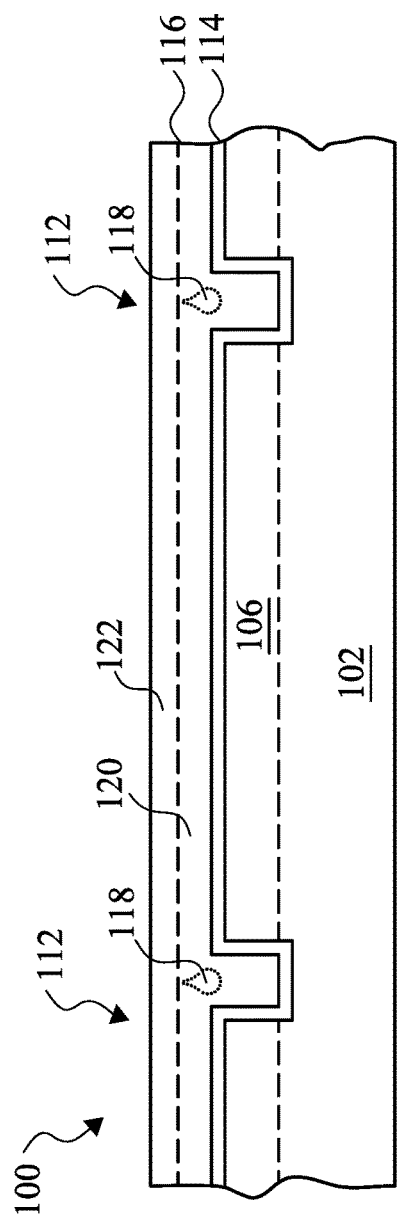
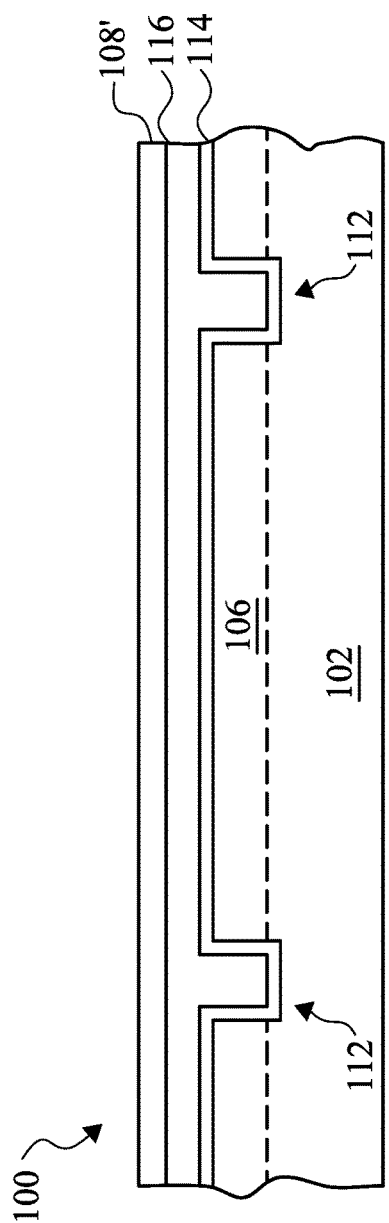

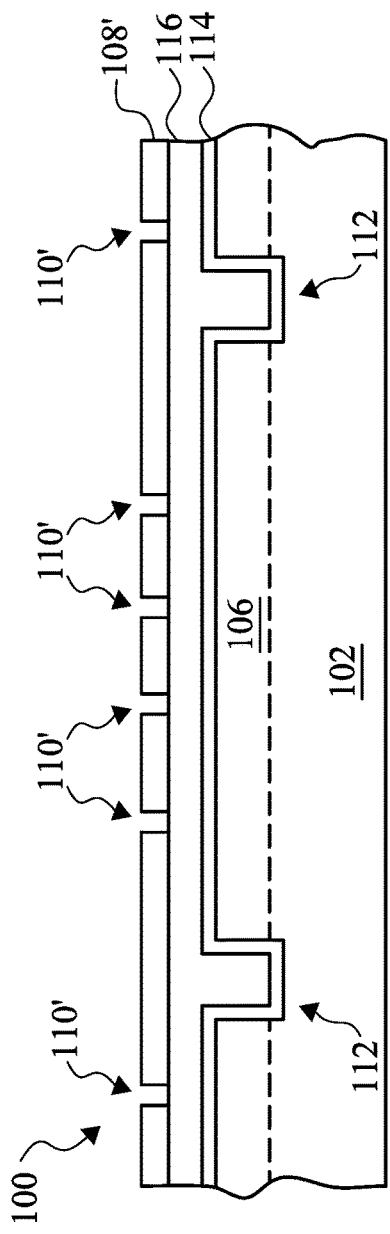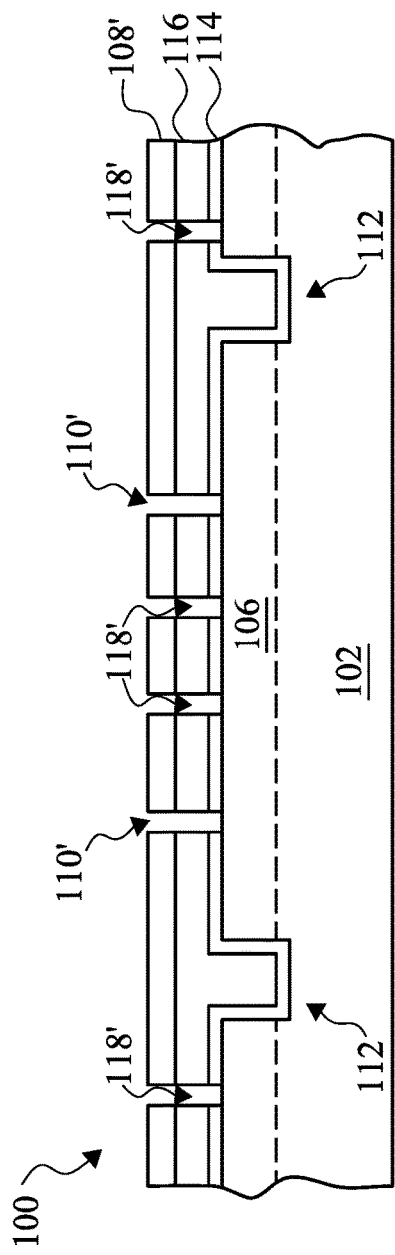

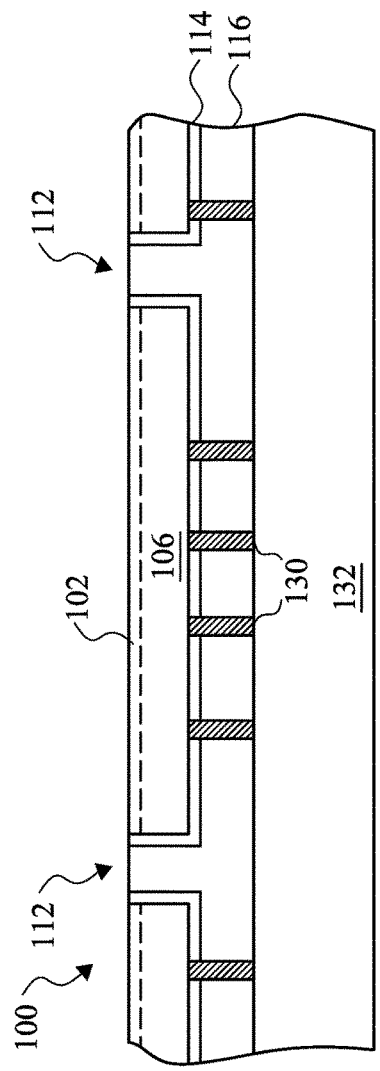
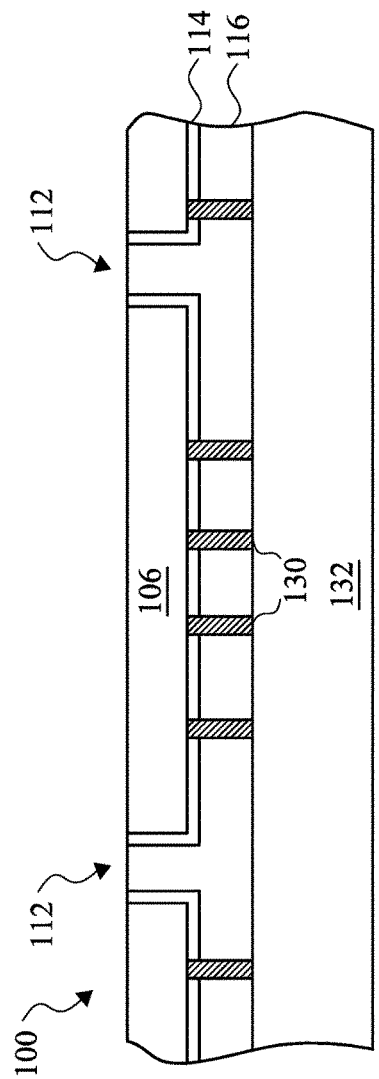
Fig. 17
Fig. 18

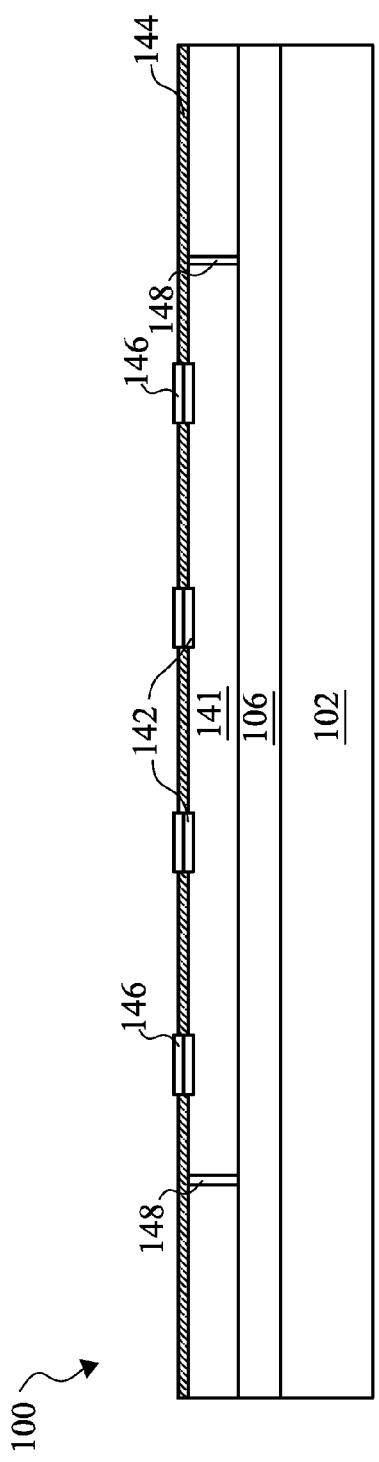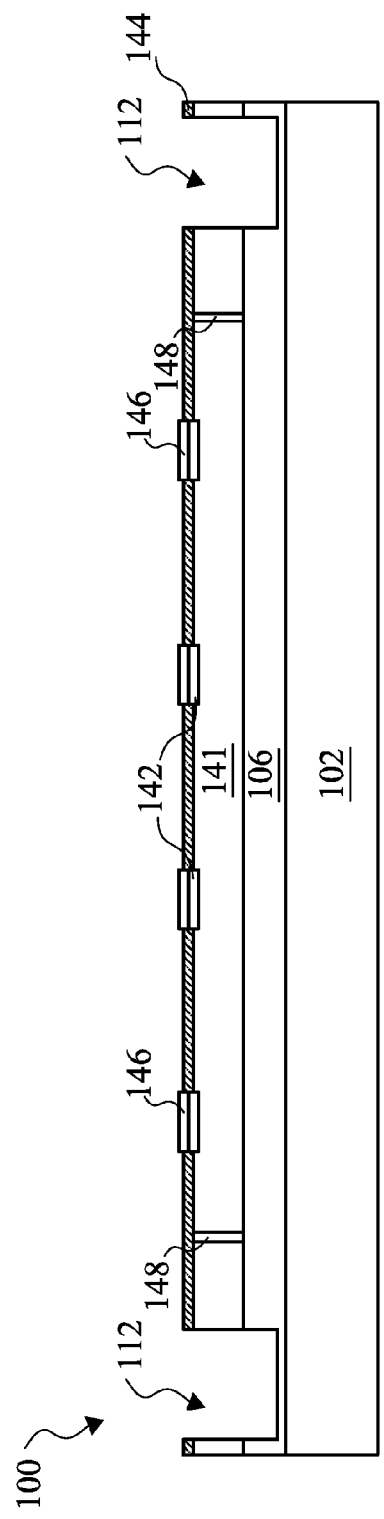

SEMICONDUCTOR DEVICES, METHODS OF MANUFACTURE THEREOF, AND METHODS OF SINGULATING SEMICONDUCTOR DEVICES

PRIORITY CLAIM AND CROSS-REFERENCE

This application claims the benefit of U.S. Provisional Application No. 62/293,409 filed on Feb. 10, 2016 and entitled, "Semiconductor Devices, Methods of Manufacture Thereof, and Methods of Singulating Semiconductor Devices," which provisional patent application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Dozens or hundreds of integrated circuits are typically manufactured on a single semiconductor wafer. The individual dies are singulated by sawing the integrated circuits along scribe lines. The individual dies may then be used in an end application or packaged separately, in multi-chip modules, or in other types of packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 20 are cross-sectional views that illustrate a method of manufacturing a semiconductor device at various stages in accordance with some embodiments of the present disclosure.

FIGS. 22, 23, 25, and 27 through 29 are cross-sectional views that illustrate a method of manufacturing a semiconductor device at various stages in accordance with some embodiments.

DETAILED DESCRIPTION

Figure 1:
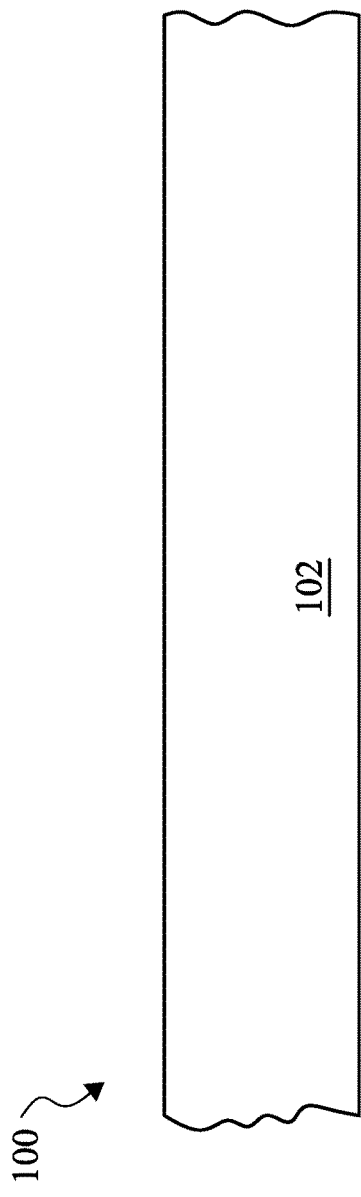

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of manufacturing semiconductor devices and methods of singulating semiconductor devices are disclosed in the present disclosure. Integrated circuit dies are singulated from wafer form without using a die saw or laser in some embodiments. Trenches are formed in singulation regions of a wafer, and two insulating materials are formed within the trenches and over a side of the wafer, in some embodiments. Contacts are formed within the insulating materials, and a carrier is attached to the contacts, in some embodiments. One of the insulating materials is removed, which singulates the wafer, in some embodiments. Throughout the various views and illustrative embodiments, like reference numerals are used to designate like elements.

FIGS. 1 through 20 are cross-sectional views that illustrate a method of manufacturing a semiconductor device 100 at various stages in accordance with some embodiments of the present disclosure. Referring first to FIG. 1, a substrate 102 is provided. The substrate 102 may be part of a wafer, for example. The substrate 102 may comprise a semiconductor substrate, such as a silicon substrate, a silicon carbon substrate, a silicon germanium substrate, or a substrate formed of other semiconductor materials, as examples. The substrate 102 may comprise a bulk substrate, a semiconductor-on-insulator (SOI) substrate, or other acceptable types of substrates. The substrate 102 may be lightly doped with a p-type or an n-type impurity. The substrate 102 may comprise a silicon wafer or a wafer comprised of another type of semiconductor material in some embodiments.

Figure 2:
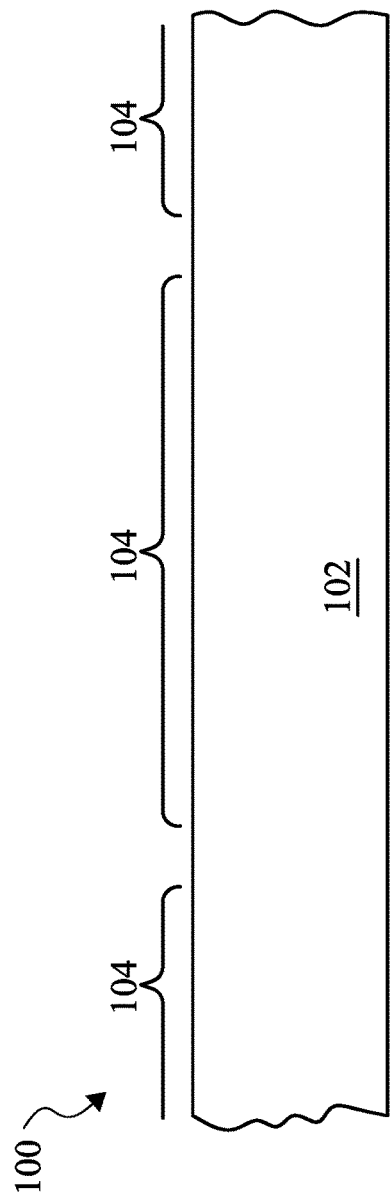

The substrate 102 comprises a plurality of integrated circuit die regions 104 in some embodiments, as illustrated in FIG. 2. The integrated circuit die regions 104 are separated from one another by portions of the substrate 102 that may comprise singulation regions in some embodiments, for example. The integrated circuit die regions 104 may comprise a square, rectangular, or other shapes in a top view of the substrate 102, for example. The integrated circuit die regions 104 may be formed on the substrate 102 in an array of rows and columns. Dozens or hundreds of integrated circuit die regions 104 may be defined on a substrate 102, for example. Other numbers of integrated circuit die regions 104 may be defined on the substrate 102, and the integrated circuit die regions 104 may be formed in other arrangements or configurations.

Figure 3:
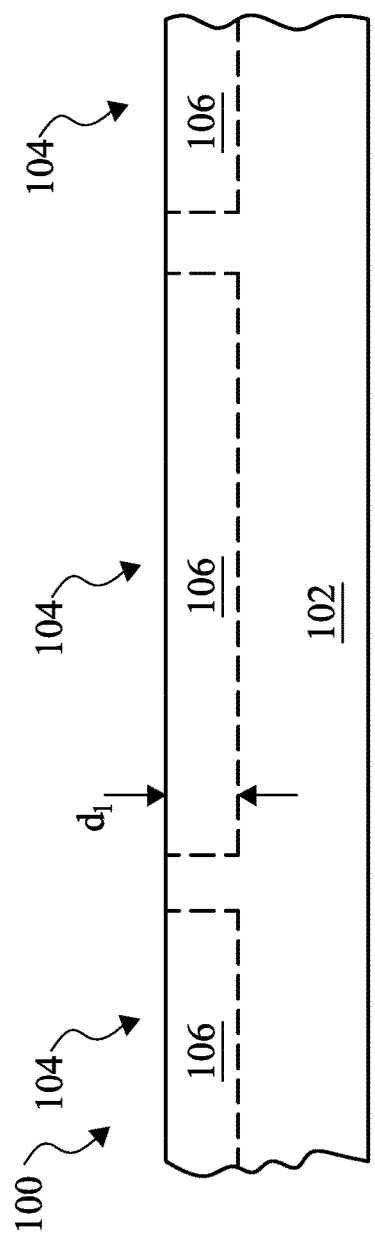
Figure 4:
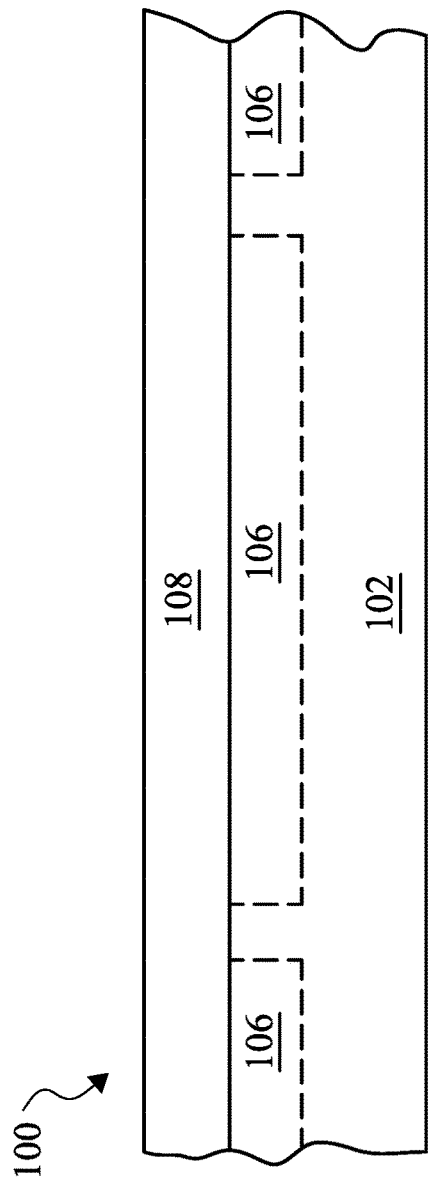

Active circuitry is formed in active circuit regions 106 of the integrated circuit die regions 104, as illustrated in FIG. 3. The active circuitry is formed within or over the substrate 102 in the active circuit regions 106, for example. The active circuitry in the active circuit regions 106 is disposed in an upper portion of the substrate 102 in the view shown in FIG. 3, for example. The active circuitry formed in the integrated circuit die regions 104 of the substrate 102 may be any type of circuitry suitable for a particular application. The active circuitry may comprise one or more logic, memory, processor, or other type of devices, as examples. As other examples, the active circuitry formed within or on the active circuit regions 106 of the substrate 102 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. Other active circuitry may be used as appropriate for a given application.

The active circuitry is formed a first side of the substrate 102 in some embodiments. The first side of the substrate 102 comprises the top side of the substrate 102 in the view shown in FIG. 3, for example. The active circuit regions 106 may comprise a depth comprising dimension $d_1$ within a top surface of the substrate 102, wherein dimension $d_1$ comprises about one-half the thickness of the substrate 102 or less in some embodiments, for example. The active circuit regions 106 may also comprise other depths within the substrate 102, such as about one-half the thickness of the substrate 102 or greater.

In some embodiments, an interconnect structure (not shown in FIGS. 1 through 20: see interconnect structure 141 shown in FIG. 22) is formed over the active circuitry of the active circuit regions 106.

A trench 112 is formed within the first side of the substrate 102, as shown in FIGS. 4 through 7. The trench 112 is formed around a portion of the substrate 102 in some embodiments. The trench 112 is formed around the active circuit region 106 in some embodiments, for example. In some embodiments, a trench 112 is formed around each of the active circuit regions 106 of the substrate 102, for example. A plurality of the trenches 112 is formed in the substrate 102, with each of the plurality of trenches 112 being disposed around a portion of the substrate 102, in some embodiments. The plurality of trenches 112 are also formed in the interconnect structure 141 in some embodiments wherein an interconnect structure 141 is included on the semiconductor device 100 (see FIG. 23).

The trench 112 is formed using a lithography process in some embodiments. For example, in FIG. 4, a photoresist 108 is formed over the substrate 102. The photoresist 108 comprises a photosensitive material. The photoresist 108 is patterned using a photolithography process, by providing a lithography mask having a desired pattern thereon, and exposing the photoresist 108 to light or energy transmitted through or reflected from the lithography mask. The photoresist 108 is then developed, and exposed (or unexposed, depending on whether the photoresist 108 comprises a positive or negative photoresist) portions of the photoresist 108 are removed by an ashing and/or etch process, leaving a patterned layer of the photoresist 108 as illustrated in FIG. 5. The patterned photoresist 108 comprises patterns 110 that comprise a desired shape for the trenches 112.

In FIG. 6, the patterns 110 in the photoresist 108 are transferred to the underlying substrate 102 using an etch process, forming the trenches 112. The photoresist 108 is used as an etch mask during the etch process, for example. The etch process comprises an etch process suitable for removing portions of the substrate 102 to form the trenches 112. The trenches 112 are formed around the active circuit regions 106 in some embodiments, for example. The trenches 112 are formed around portions of the substrate 102 in other embodiments. The trenches 112 encircle the active circuit regions 106 and/or portions of the substrate 102 in some embodiments, for example. The trenches 112 may comprise continuous trenches that are in a shape of a square or rectangle around the active circuit regions 106 and/or portions of the substrate 102 in some embodiments. In some embodiments, the trenches 112 are formed in singulation regions of the substrate 102, for example. In some embodiments, the trenches 112 comprise a depth within the substrate 102 comprising dimension $d_2$, wherein dimension $d_2$ is substantially the same as dimension $d_1$ of the active circuit region 106 or greater than dimension $d_1$ of the active circuit region 106, as shown in FIG. 6. Dimension $d_1$ is also referred to herein as a first depth, and dimension $d_2$ is also referred to herein as a second depth, wherein the second depth is greater than the first depth in some embodiments, for example. The trenches 112 may comprise a relatively high aspect ratio (depth to width) in some embodiments, such as about 4:1 to about 8:1 or greater in some embodiments. For example, a width of the trench 112 may comprise about 0.9 μm and a depth of the trench 112 may comprise about 8.3 μm in some embodiments. The trenches 112 may also comprise other dimensions.

The photoresist 108 is then removed, as shown in FIG. 7.

A first insulating material 114 is formed over the first side of the substrate 102 and the trenches 112, as shown in FIG. 8. The first insulating material 114 comprises $Al_2O_3$ formed using atomic layer deposition (ALD) in some embodiments. The first insulating material 114 comprises a thickness comprising dimension $d_3$ which comprises about 100 Angstroms to about 300 Angstroms, for example, in some embodiments. The first insulating material 114 may comprise a thickness comprising dimension $d_3$ of about 150 Angstroms to about 200 Angstroms in some embodiments, as another example. The first insulating material 114 comprises a thickness sufficient to provide etch selectivity for a subsequently deposited second insulating material 116 and to provide a good moisture barrier for the semiconductor device 100 in some embodiments, for example. The first insulating material 114 may also comprise other materials, dimensions, and formation methods. The first insulating material 114 is substantially conformal to an underlying topography of the semiconductor device 100 in some embodiments, such as the surface of the active circuit region 106 and the trenches 112. The first insulating material 114 lines the trenches 112 and is disposed over sidewalls and a surface of the active circuit region 106. The first insulating material 114 comprises a material with good step coverage, such as $Al_2O_3$, which also provides a good moisture barrier and may be deposited at relatively low temperatures, such as about 300 degrees C., which is an advantage in back-end-of-line (BEOL) processes, for example. Other materials with similar properties may also be used for the first insulating material 114.

A second insulating material 116 is formed over the first insulating material 114, as shown in FIG. 9. In some embodiments, the second insulating material 116 comprises a first layer 120 and a second layer 122 formed over the second layer 120, as shown in phantom (e.g., in dashed lines) in FIG. 9. The first layer 120 of the second insulating material 116 is formed over the first insulating material 114, and the second layer 122 is formed over the first layer 120, for example. The second insulating material 116 comprises a material that may be etched selectively with respect to the first insulating material 114 in some embodiments. For example, the second insulating material 116 comprises a material that may etched or removed without a substantial amount of removal of the first insulating material 114.

The second insulating material 116 comprises silicon oxide, silicon dioxide, or other oxides in some embodiments, for example. The second insulating material 116 comprises a thickness of about 1,000 Angstroms or greater in some embodiments. The second insulating material 116 may also comprise other materials and dimensions. In some embodiments, the first layer 120 comprises silicon oxide deposited using a high aspect ratio plasma (HARP) oxide process, and the second layer 122 comprises silicon oxide deposited using a high density plasma (HDP) oxide process, as examples. Forming the second insulating material 116 comprises forming the first layer 120 of the second insulating material 116 comprising a HARP oxide, and/or forming the second insulating material 116 comprises forming the second layer 122 of the second insulating material 116 comprising an HDP oxide in some embodiments, for example. The HARP oxide and/or HDP oxide may be formed by HDP-chemical vapor deposition (CVD) or other methods, for example.

In some embodiments, an aperture 118 is formed in the second insulating material 116 during the formation of the second insulating material 116 proximate the trenches 112, as illustrated in phantom in FIG. 9. The aperture 118 comprises a void in the second insulating material 116 that may extend along a length of the trenches 112. The aperture 118 may be formed within the trenches 112 and/or above the trenches 112.

In some embodiments, after the deposition of the second insulating material 116, a surface of the second insulating material 116 is planarized, using a planarization process such as a chemical-mechanical polish (CMP) process and/or and etch process. In some embodiments, the second insulating material 116 is not planarized.

Figure 13:
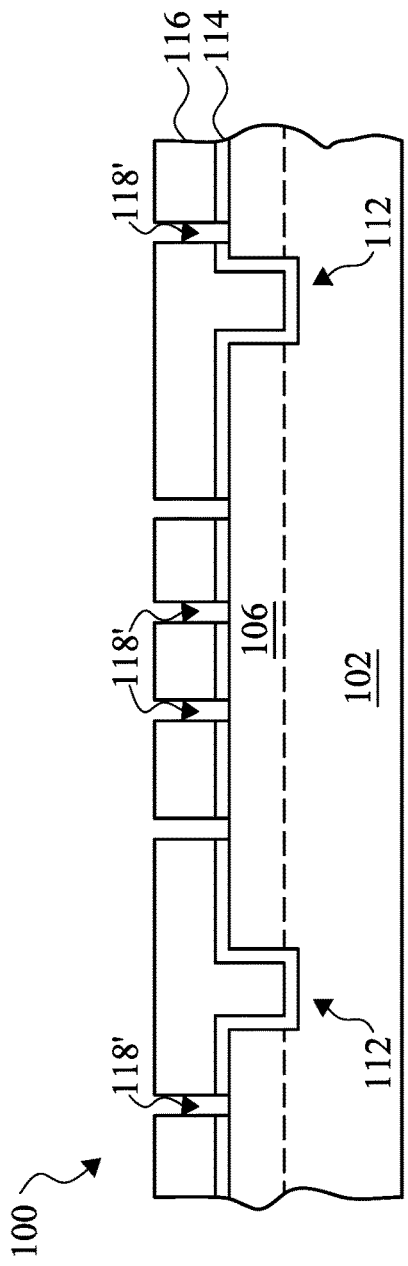

The second insulating material 116 and the first insulating material 114 are then patterned to form a plurality of apertures 118' in the second insulating material 116 and first insulating material 114 over the portion of the substrate 102 and/or active circuit region 106 surrounded by the trench 112, as shown in FIGS. 10 through 13. The second insulating material 116 and the first insulating material 114 may be patterned using a lithography process and an etch process that is suitable for the materials of the second insulating material 116 and the first insulating material 114, for example. In FIG. 10, a photoresist 108' is deposited or formed over a surface of the second insulating material 116. In FIG. 11, the photoresist 108' is patterned using a lithography process with a pattern 110' for a plurality of features that will be formed within the second insulating material 116 and the first insulating material 114. In FIG. 12, the photoresist 108' is used as an etch mask during an etch process for the second insulating material 116 and the first insulating material 114, forming apertures 118' in the second insulating material 116 and the first insulating material 114. In FIG. 13, the photoresist 108' is removed.

The apertures 118' may comprise a circular or oval shape in a top view of the semiconductor device 100, for example. The apertures 118' may also comprise other shapes, such as square, rectangular, or polygonal, as examples. The apertures 118' may also comprise a shape of a plug (e.g., a cylindrical plug shape) or a segment (e.g., a rectangular shape) in some embodiments. The apertures 118' may comprise a shape of a contact or a contact pad in some embodiments, as other examples.

The apertures 118' formed within the second insulating material 116 and first insulating material 114 are also referred to herein as first apertures, and the apertures 118 that form within the second insulating material 116 proximate the trenches 112 are also referred to herein as second apertures.

Figure 14:
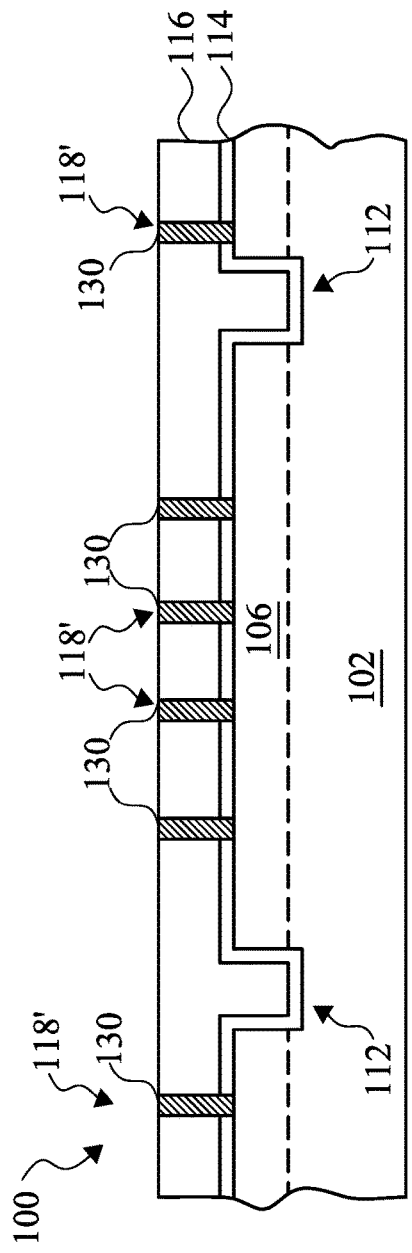

The apertures 118' in the second insulating material 116 and the first insulating material 114 are filled with a material to form features 130, as shown in FIG. 14. The features 130 are formed in the second insulating material 116 and the first insulating material 114 over the portion of the substrate 102 and/or active circuit region 106 surrounded by the trench 112. The features 130 may comprise contacts, and the features 130 are also referred to herein as contacts in some embodiments. In some embodiments, the features 130 are formed using a plating process, such as electro-less plating. In some embodiments, the features 130 are formed over conductive regions of the active circuit region 106, and the conductive regions may function as a seed for an electro-less plating process for the features 130, for example. In some embodiments wherein the features 130 comprise contacts, the features 130 may comprise gold or a gold alloy, for example. In some embodiments, the features 130 may comprise other metals, a semiconductive material, a nitride material, an oxide material other than a type of oxide used for the second insulating material 116, or other materials, as examples. In some embodiments, the features 130 may comprise plugs of a material, segments of a material, contacts, contact pads, and/or a combination thereof, as examples.

Figure 27:
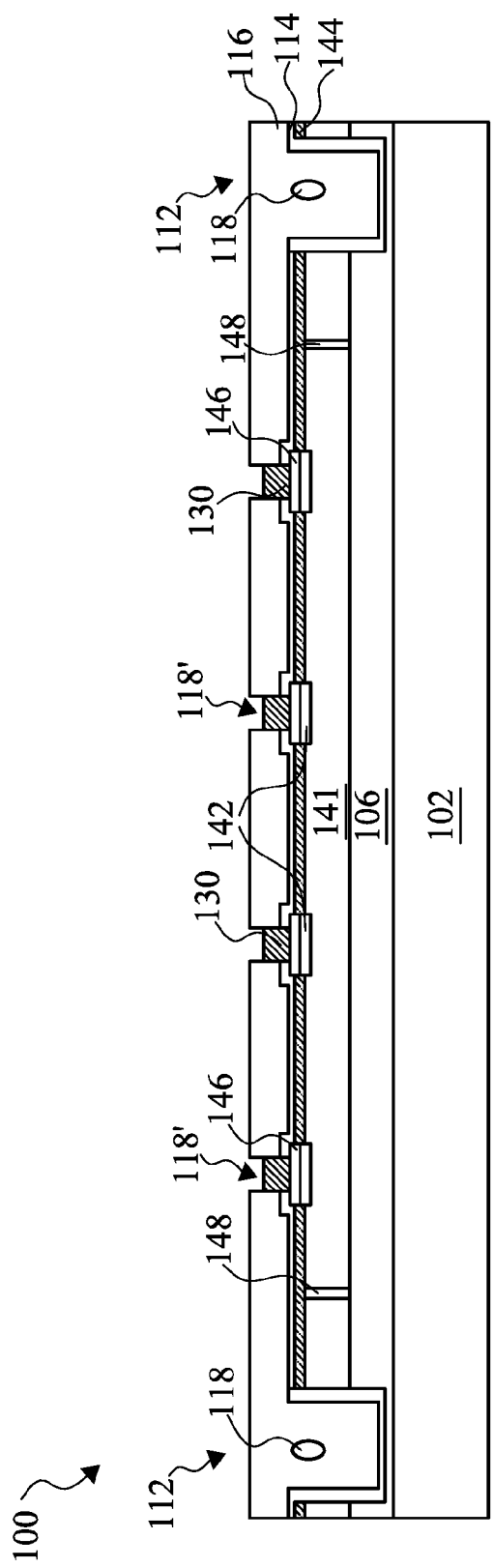

In some embodiments wherein the features 130 are formed using a plating process, the features 130 may be formed fully within the second insulating material 116 and the first insulating material 114, as shown in FIG. 14. The features 130 may also be formed partially within the second insulating material 116 and the first insulating material 114, as shown in FIG. 27.

Referring again to FIG. 14, the features 130 may also be formed using a damascene process in some embodiments, by depositing a material over the patterned second insulating material 116 and first insulating material 114 to fill the apertures 118' in the second insulating material 116 and first insulating material 114. A portion of the material may reside over a top surface of the second insulating material 116 after the deposition process of the material. A planarization process such as a chemical mechanical polish (CMP) and/or an etch process is then used to remove excess material from over a top surface of the second insulating material 116. In some embodiments, the material of the features 130 may be applied using a process such as a spin-on process, wherein the material does not form on the surface of the second insulating material 116, and a planarization process may not be required.

Figure 15:
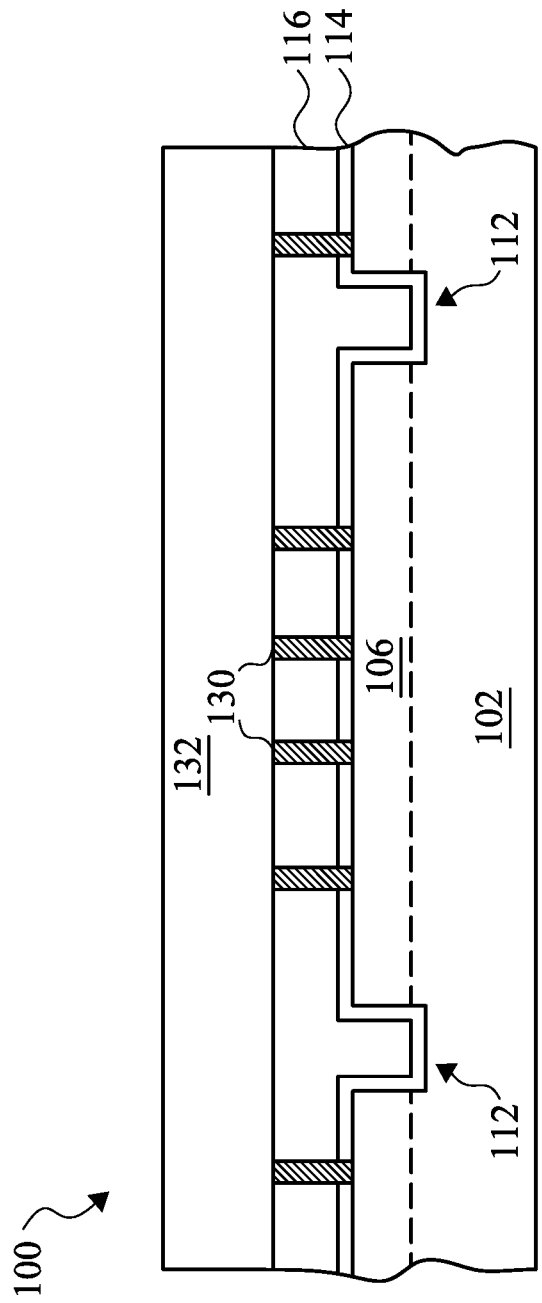

After the features 130 are formed within the second insulating material 116 and first insulating material 114, a carrier 132 is provided, as shown in FIG. 15. The carrier 132 may comprise a glass carrier substrate, a ceramic carrier substrate, a wafer such as a semiconductor wafer, a tape, or the like. The carrier 132 is later removed after the manufacturing process and/or singulation process for the semiconductor device 100 in some embodiments, for example. The carrier 132 may include a release layer (not shown in FIG. 15; see release layer 138 shown in FIG. 28) formed thereon which may comprise a polymer-based material. The release layer 138 may later be removed along with the carrier 132 after subsequent processing steps. In some embodiments, the release layer 138 may comprise an epoxy-based thermal-release material, which loses its adhesive property when heated, such as a light-to-heat-conversion (LTHC) release coating. In other embodiments, the release layer 138 may comprise an ultra-violet (UV) glue, which loses its adhesive property when exposed to UV light. The release layer 138 may be dispensed as a liquid and cured, and may be a laminate film laminated onto the carrier 132, or the like. An adhesive (also not shown) may be formed or dispensed over the release layer. The adhesive may comprise a die attach film (DAF), a glue, a polymer material, or the like.

The carrier 132 is coupled to the features 130 and the second insulating material 116, as shown in FIG. 15. In some embodiments, the carrier 132 is coupled to all of the features 130. The semiconductor device 100 and the carrier 132 are then inverted in some embodiments, as shown in FIG. 16.

Figure 16:
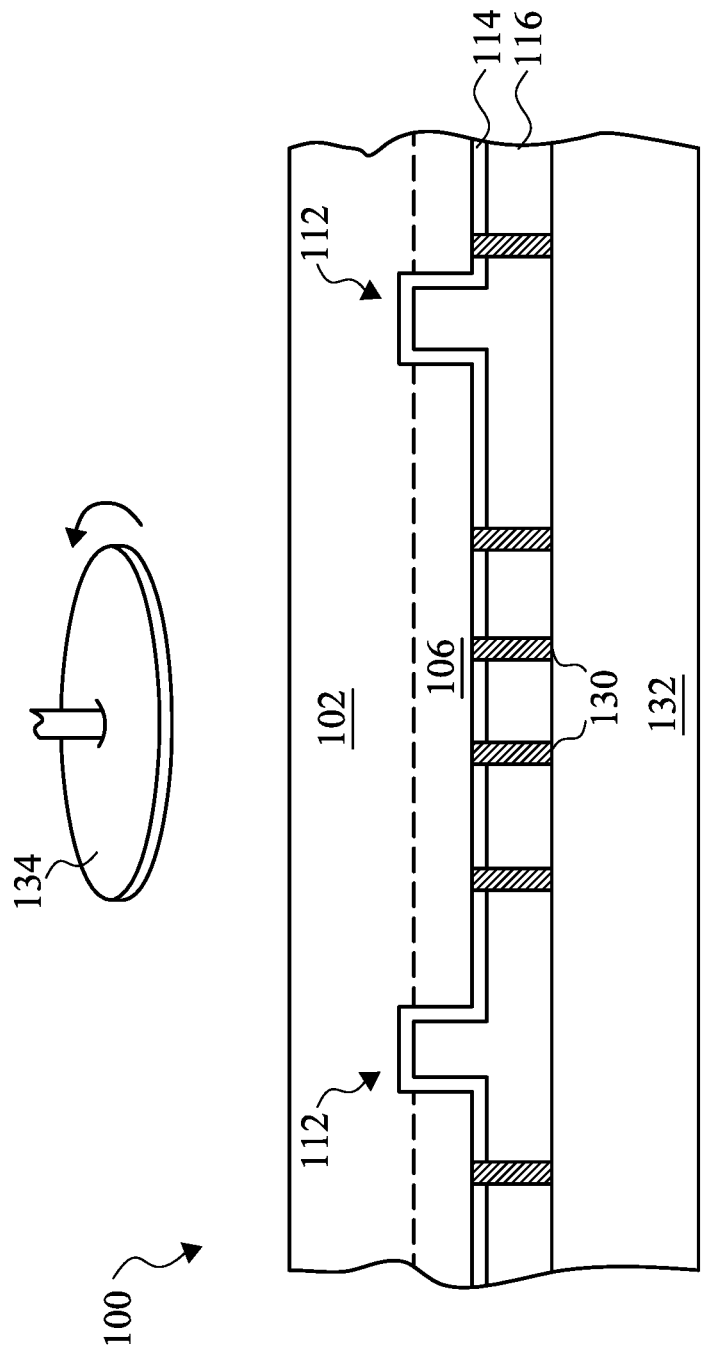

A second side of the substrate 102 is then planarized, also shown in FIG. 16. The second side of the substrate 102 is opposite the first side of the substrate 102 that the trenches 112 were formed in, for example. The second side of the substrate 102 may be planarized using a planarizing device 134 and/or an etch process in some embodiments, for example. The planarizing device 134 may comprise a CMP tool that is adapted to CMP the substrate 102, for example. In some embodiments, planarizing the second side of the substrate 102 comprises removing the first insulating material 114 disposed over a surface of the second insulating material 116 within the trenches 112, as shown in FIGS. 17 and 18. A portion of the substrate 102 and a portion of the first insulating material 114 that was formed on a bottom of the trenches 112 (see FIG. 8) is removed during the planarization process, for example, so that the second insulating material 116 that was formed proximate the bottom of the trenches 112 (see FIG. 9) is left exposed.

In some embodiments, a portion of the substrate 102 not containing active circuitry is removed, and a portion of the substrate 102 not containing active circuitry is left remaining, as shown in FIG. 17. In some embodiments, an entirety of the substrate 102 portion not containing active circuitry is removed, as shown in FIG. 18.

Figure 19:
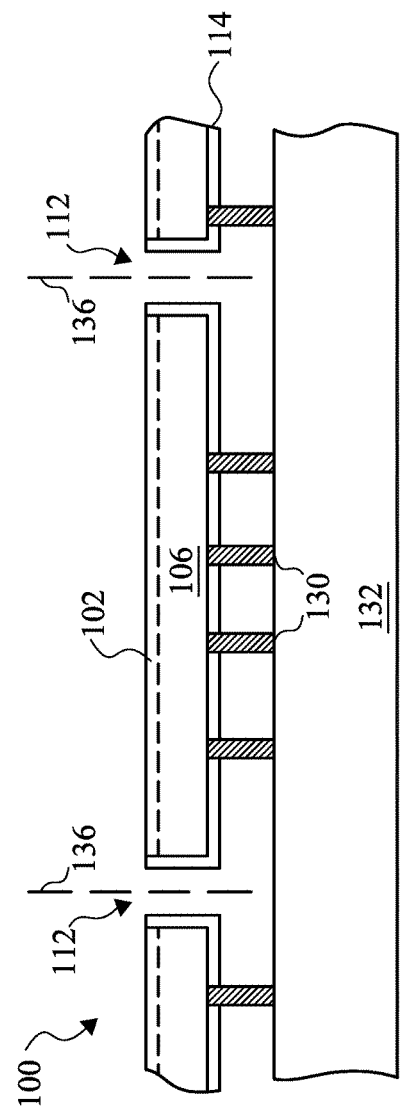

Referring next to FIG. 19, the second insulating material 116 is then removed using an etch process. In some embodiments, the etch process may comprise a vapor hydrofluoric acid etch process, for example. Other types of etch processes may also be used to remove the second insulating material 116. Removing the second insulating material 116 leaves the semiconductor device 100 coupled to the carrier 132 by the features 130, as illustrated in FIG. 19. In some embodiments, the trenches 112 are disposed proximate singulation regions 136 of the semiconductor device 100. Removing the second insulating material 116 results in singulating the semiconductor device 100 into a plurality of integrated circuit dies 140 in some embodiments. Removing the second insulating material 116 comprises singulating a plurality of integrated circuit dies 140 formed within the substrate 102 (i.e., comprising the active circuit region 106 formed within the substrate 102) in some embodiments, for example. For example, FIG. 20 shows a plurality of integrated circuit dies 140 after the removal of the carrier 132 from the features 130.

Because a die saw is not used for the singulation process, sidewalls of the active circuitry 106 or the substrate 102 do not comprise scribe line markings. Likewise, sidewalls of the first insulating material 114 disposed on sidewalls of the active circuitry 106 or the substrate 102 do not comprise scribe line markings. A portion of the features 130 is disposed within the first insulating material 114 proximate the active circuit region 106 of the integrated circuit dies 140.

Figure 20:
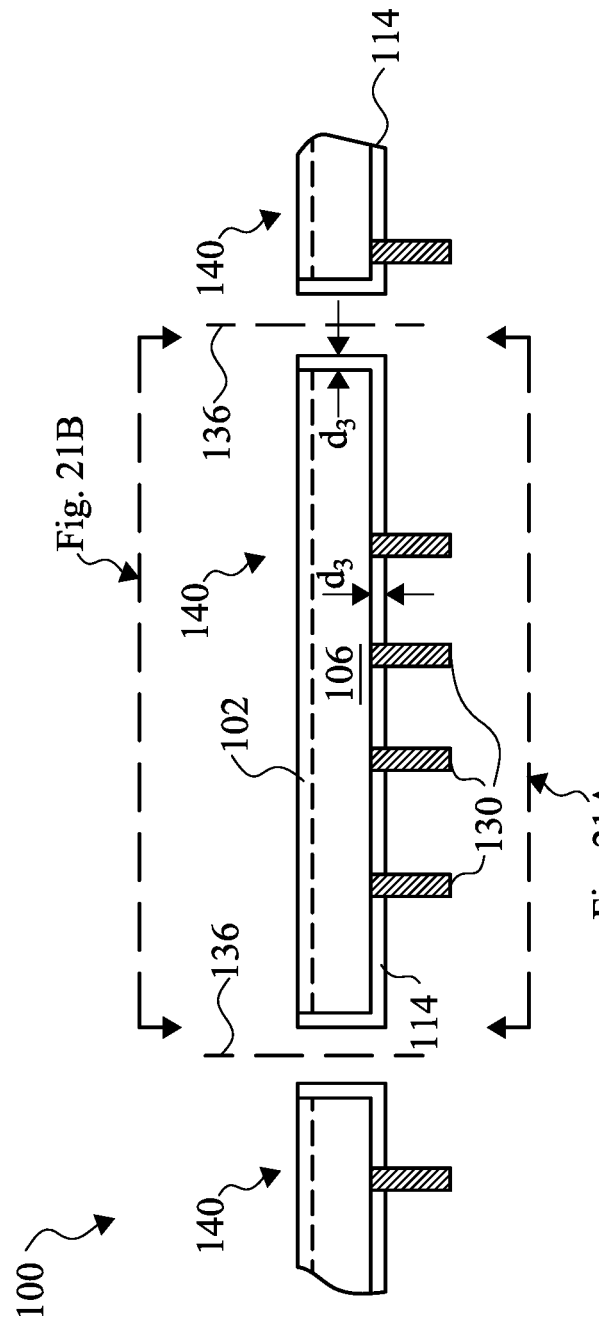
Figure 21B:
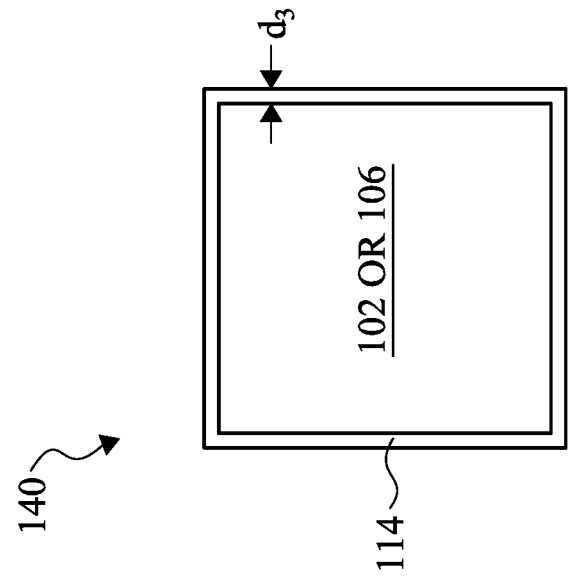
FIG. 21B is a top view of an integrated circuit die shown in FIG. 20 in accordance with some embodiments.
Figure 21A:
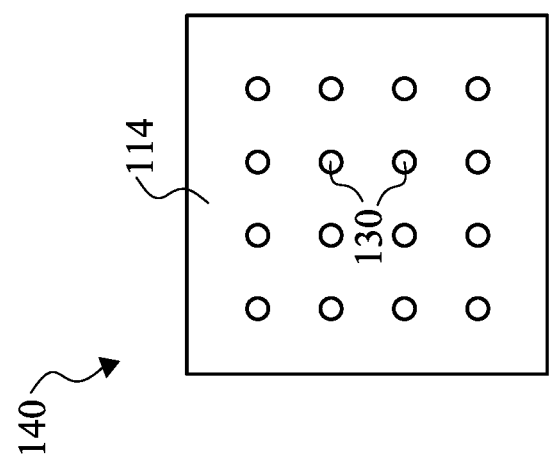
FIG. 21A is a bottom view of an integrated circuit die shown in FIG. 20 in accordance with some embodiments.

FIG. 21A is a bottom view of an integrated circuit die 140 shown in FIG. 20 in accordance with some embodiments. An example pattern of a plurality of features 130 is illustrated, wherein the features 130 are arranged in an array of rows and columns. The features 130 may also be arranged along edges of the integrated circuit die 140, along one or more sides of the integrated circuit die 140, or in random or other patterns on the bottom of the integrated circuit die 140, as examples.

FIG. 21B is a top view of an integrated circuit die 140 shown in FIG. 20 in accordance with some embodiments. The top of the integrated circuit die 140 comprises either a portion of the substrate 102 or a portion of the active circuit region 106. Sidewalls of the integrated circuit die 140 are covered by the first insulating material 114 having a thickness comprising dimension $d_3$.

In accordance with some embodiments, after singulation, the semiconductor device 100 comprises a plurality of integrated circuit dies 140 that each comprise active circuitry formed within or over a substrate 102 (e.g., in the active circuit regions 106). The integrated circuit dies 140 include a plurality of contact pads (see contact pads 146 shown in FIG. 22) disposed over the active circuitry in the active circuit regions 106. A first insulating material 114 comprising a layer of $Al_2O_3$ is disposed over sidewalls and a surface of the active circuitry and a portion of the plurality of contact pads 146. A feature 130 comprising a contact is disposed over each of the plurality of contact pads 146. A portion of the features 130 comprising contacts is disposed within the first insulating material 114 comprising the layer of $Al_2O_3$.

FIGS. 22, 23, 25, and 27 through 29 are cross-sectional views that illustrate a method of manufacturing a semiconductor device 100 at various stages in accordance with some embodiments. Additional elements and features that may be included in or on a semiconductor device 100 are illustrated. Referring next to FIG. 22, a semiconductor device 100 includes an active circuit region 106 that includes active circuitry formed within a portion (e.g., an upper portion in the view shown in FIG. 22) of a substrate 102. An interconnect structure 141 is disposed over the active circuit region 106. The interconnect structure 141 is formed in a BEOL, and the active circuitry in the active circuit region 106 comprises circuitry formed in a front-end-of-line (FEOL) in some embodiments, for example. The interconnect structure 141 comprises a plurality of conductive features disposed within a plurality of insulating materials. The interconnect structure 141 may comprise inter-layer dielectrics (ILD) and inter-metallization dielectric (IMD) layers. For example, the insulating materials may be formed of a low-K dielectric material, such as phosphosilicate glass (PSG), borophosphosilicate glass (BPSG), fluorosilicate glass (FSG), SiOxCy, spin-on-glass, spin-on-polymers, silicon carbon material, compounds thereof, composites thereof, combinations thereof, or the like, formed using any suitable methods known in the art, such as spinning, chemical vapor deposition (CVD), and plasma-enhanced CVD (PECVD).

The conductive features of the interconnect structure 141 interconnect various passive and active components (not shown) formed in and on the active circuit region 106 to one another and to external components. The interconnect structure 141 may include, for instance, two or more layers of conductive traces vertically interconnected by vias (not shown) embedded within dielectric layers that are formed using damascene processes or subtractive etch techniques. Conductive features of the interconnect structure 141 may comprise conductive lines, vias, and/or plugs that comprise a conductive material such as copper, a copper alloy, or other metals. One, two, three, or more conductive feature layers can be included in the interconnect structure 141 of the semiconductor device 100.

Regardless of the number of layers of the interconnect structure 141, the semiconductor device 100 includes a top interconnect layer 142. The top interconnect layer 142 comprises an uppermost interconnect layer of the interconnect structure 141, for example. A top passivation layer 144 may be disposed over the interconnect structure 141, also illustrated in FIG. 22. The passivation layer 144 may comprise a polymer such as polybenzoxazole (PBO) or other insulating materials, for example.

Contact pads 146 are formed over portions of the top interconnect layer 142 in some embodiments. The contact pads 146 make electrical connection with features in the top interconnect layer 142. In some embodiments, the contact pads 146 may comprise aluminum covered by a layer of TaN. The contact pads 146 may also comprise other materials.

FIG. 22 also illustrates a seal ring 148 that is formed within the interconnect structure 141 in some embodiments. The seal ring 148 is disposed around edges of an integrated circuit die region proximate singulation regions, for example. The seal ring 148 may be formed within the conductive feature layers of the interconnect structure 141 in some embodiments. In some embodiments, a seal ring 148 is not included.

In FIG. 23, trenches 112 are formed around portions of the substrate 102, e.g., around the active circuit regions 106 formed within a portion of the substrate 102, using a method described with respect to FIGS. 4 through 7.

Figure 24:
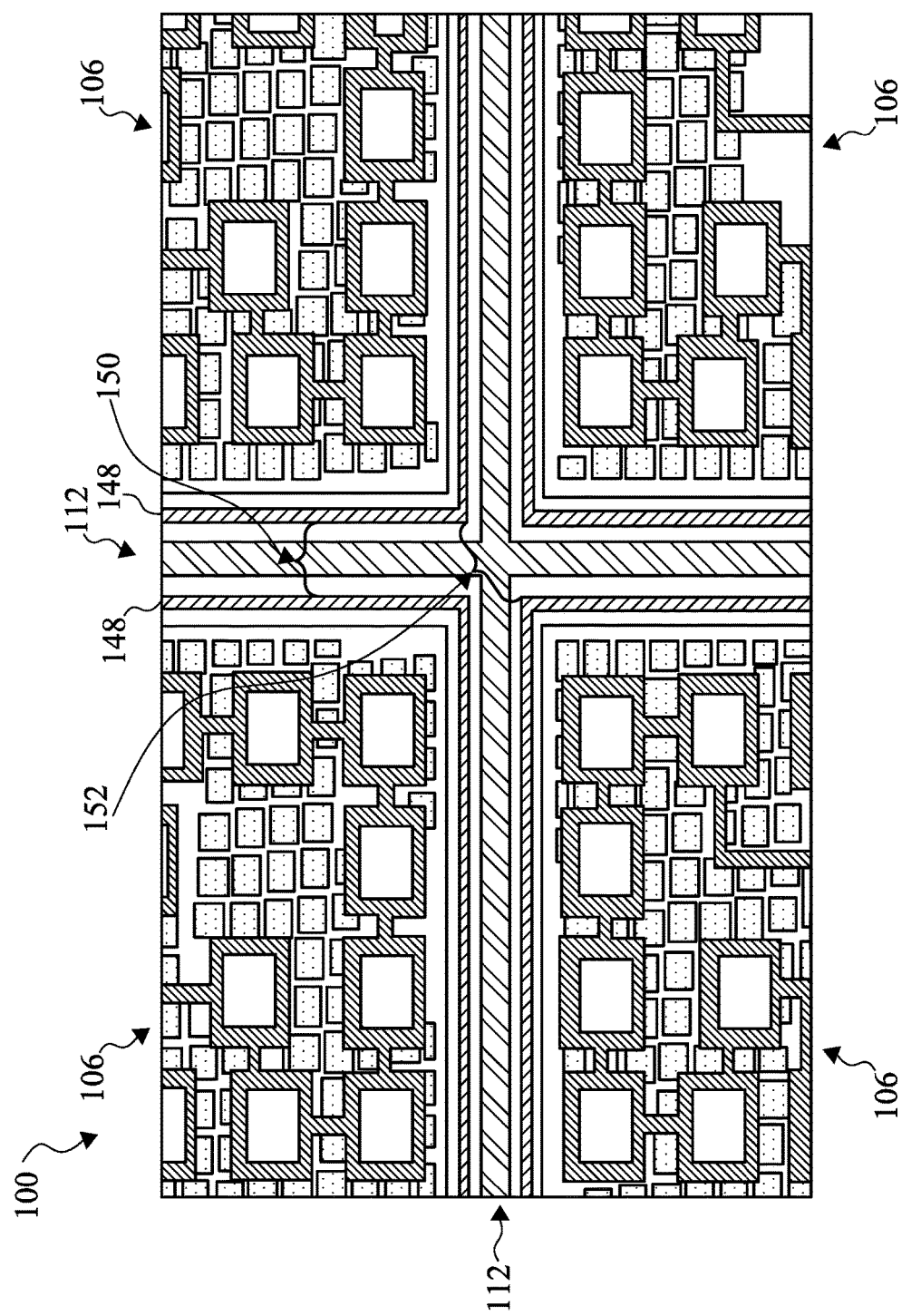
FIG. 24 is a top view of a portion of the semiconductor device shown in FIG. 23 in accordance with some embodiments.
Figure 25:
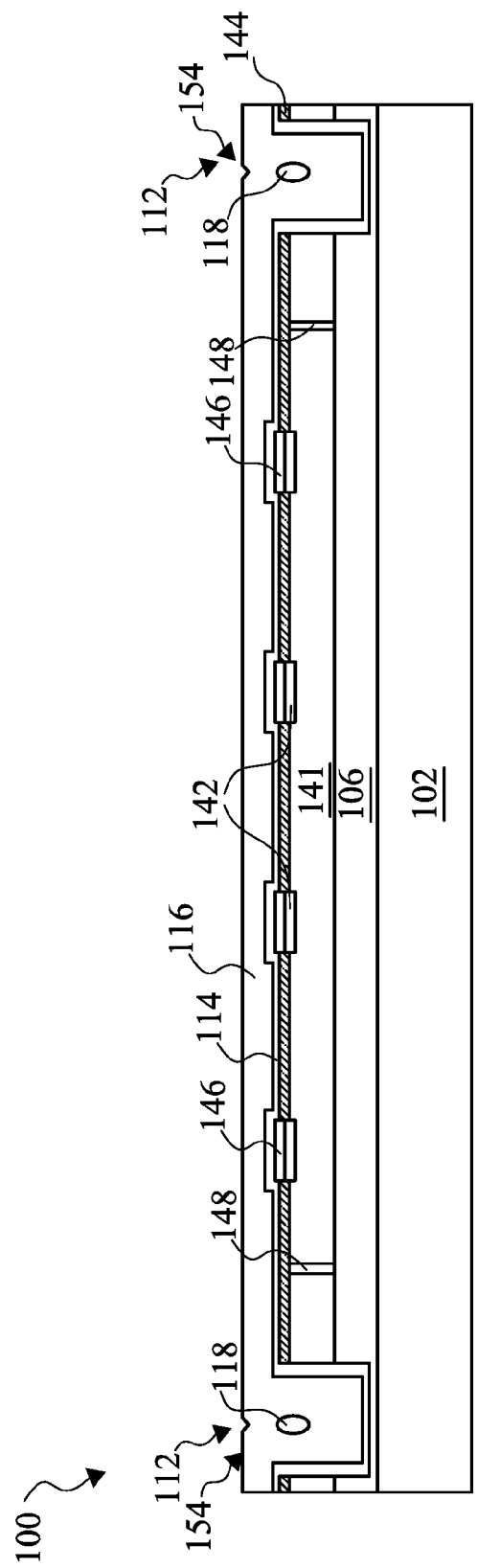

FIG. 24 is a top view of a portion of the semiconductor device 100 shown in FIG. 23 in accordance with some embodiments. An intersection of four integrated circuit dies 140 (not labeled in FIG. 24; see FIG. 29) regions of the semiconductor device 100 is shown. Circuitry and devices formed within the active circuit regions 106 is shown. The seal ring 148 is disposed around a perimeter of the integrated circuit die 140 regions. A view at 150 shows a region of a trench 112 from an edge of one integrated circuit die 140 region to another edge of an integrated circuit die 140 region. A view at 152 shows a region of two trenches 112 at an intersection of the trenches 112 from a corner of an integrated circuit die 140 region to another corner of an integrated circuit die 140 region.

Figure 26:
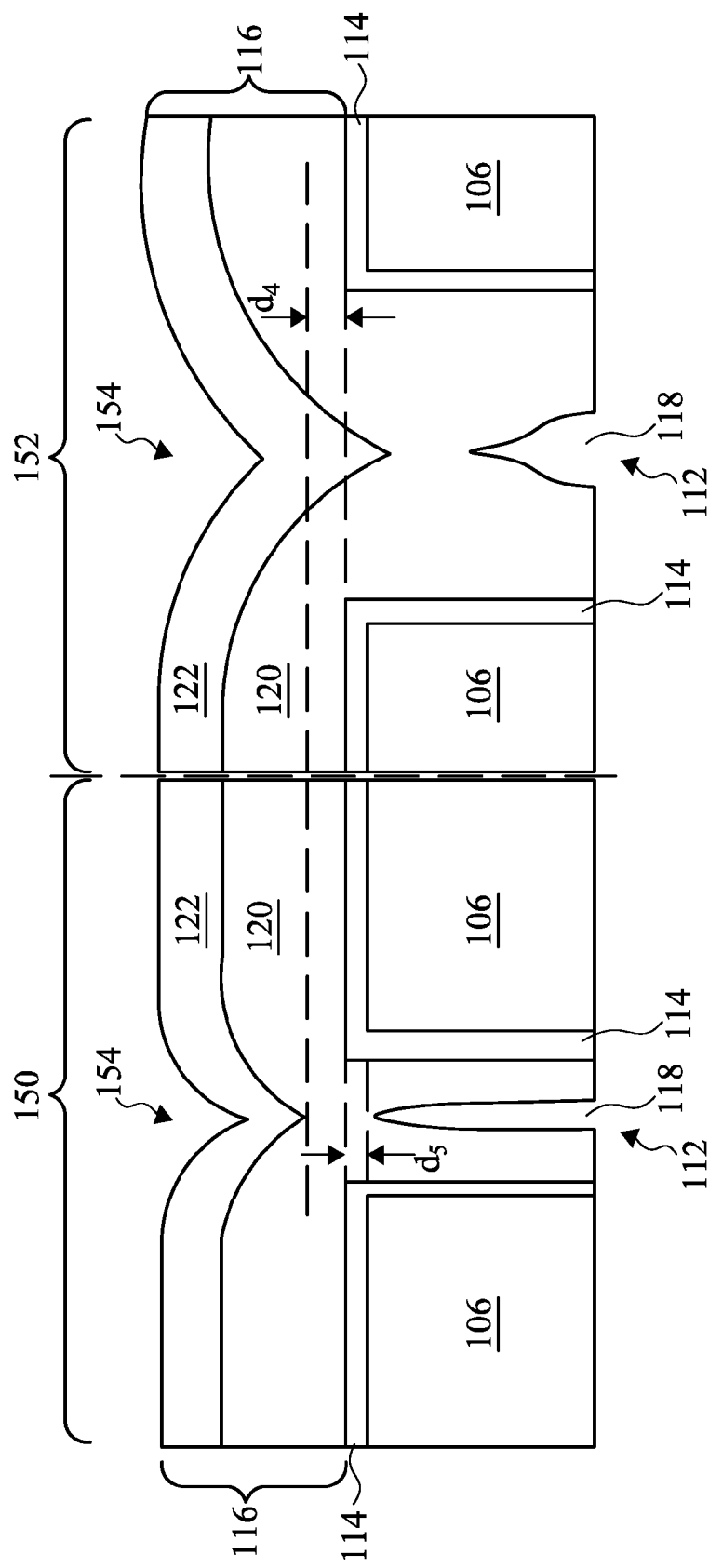
FIG. 26 is a more detailed cross-sectional view of a portion of the semiconductor device shown in FIG. 25 in accordance with some embodiments.

FIG. 26 is a cross-sectional view illustrating the semiconductor device 100 after the formation of the first insulating material 114 and the second insulating material 116 as described with reference to FIGS. 8 and 9. FIG. 26 is a more detailed cross-sectional view of a portion of the semiconductor device 100 shown in FIG. 25 in accordance with some embodiments. A more detailed view of the first layer 120 and the second layer 122 of the second insulating material 116 is illustrated in FIG. 26.

In some embodiments, a depression 154 is formed over the trenches 112 within the second insulating material 116. The depression 154 may form due to the shape of the trenches 112 having a high aspect ratio and/or due to the deposition process for the first layer 120 and/or second layer 122 of the second insulating material 116, for example.

FIG. 26 also illustrates a cross-sectional view of views 150 and 152 shown in FIG. 24. The trenches 112 are wider at the intersection of two trenches 112 from corner to corner of the integrated circuit die 140 regions. Thus, apertures 118 formed within the second insulating material 116 may have different shapes in views 150 and 152, as illustrated. Furthermore, the depression 154 in the trenches 112 may be deeper in view 152 at the intersection of two trenches 112.

In some embodiments, a planarization process is used to planarize the top surface of the second insulating material 116 in order to remove the depressions 154. The second insulating material 116 may be planarized to a height above a top surface of the first insulating material 114 by amount comprising dimension $d_4$. Dimension $d_4$ may comprise about 5,000 Angstroms or greater in some embodiments, for example. In some embodiments, an amount of the second insulating material 116 above an aperture 118 and below a top surface of the first insulating material 114 may comprise a dimension $d_5$. Dimension $d_5$ may comprise about 5,000 Angstroms or greater in some embodiments, for example. Dimensions $d_4$ and $d_5$ may also comprise other values.

FIG. 27 is a cross-sectional view that illustrates the semiconductor device 100 after the planarization process. The top surface of the second insulating material 116 after the planarization process is substantially planar, which advantageously improves the lithography process used to form the apertures 118' in the second insulating material 116 and the first insulating material 114 in some embodiments. The apertures 118' are formed over the contact pads 146 in some of the embodiments shown. The features 130 comprising contacts are formed within the apertures 118', also shown in FIG. 27. The features 130 are formed using a plating process and partially fill the apertures 118' in some embodiments.

Figure 28:
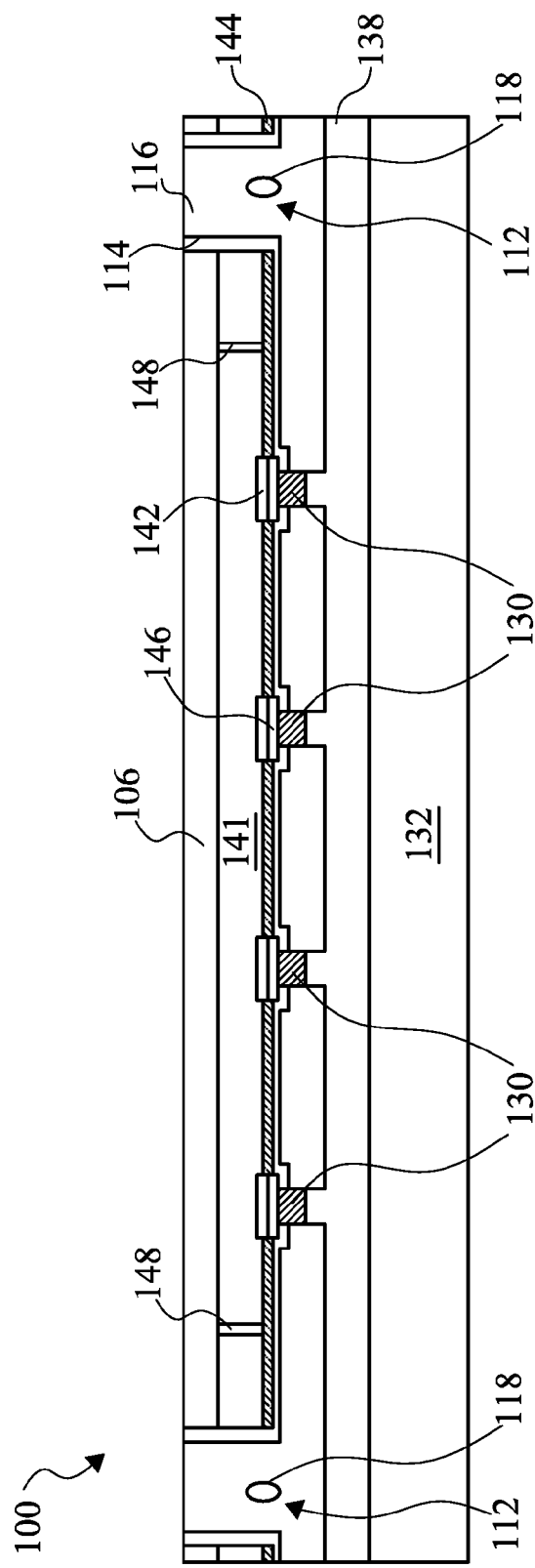

FIG. 28 shows the semiconductor device 100 after the semiconductor device 100 is coupled to a carrier 132 and is inverted. The bottom surface of the second insulating material 116 and the features 130 are coupled to the release layer 138 disposed on the carrier 132. The substrate 102 is planarized which also removes the first insulating material 114 (e.g., the portion of the first insulating material 114 that was previously in the bottom of the trenches 112) from over the second insulating material 116 within the trenches 112 in the inverted view shown in FIG. 28.

Figure 29:
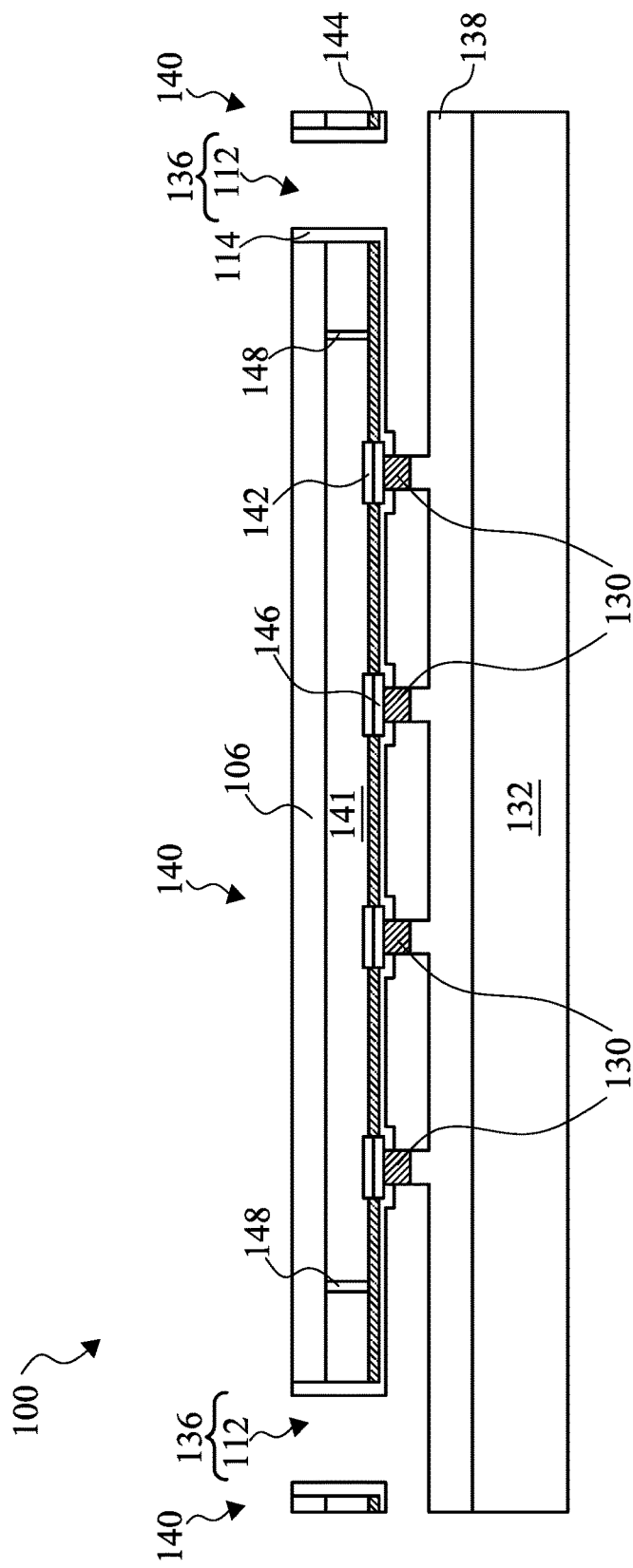

FIG. 29 illustrates the semiconductor device 100 which has been singulated into a plurality of integrated circuit dies 140 after removing the second insulating material 116. The carrier 132 and release film 138 are then removed, as described with reference to FIG. 20.

Figure 30:
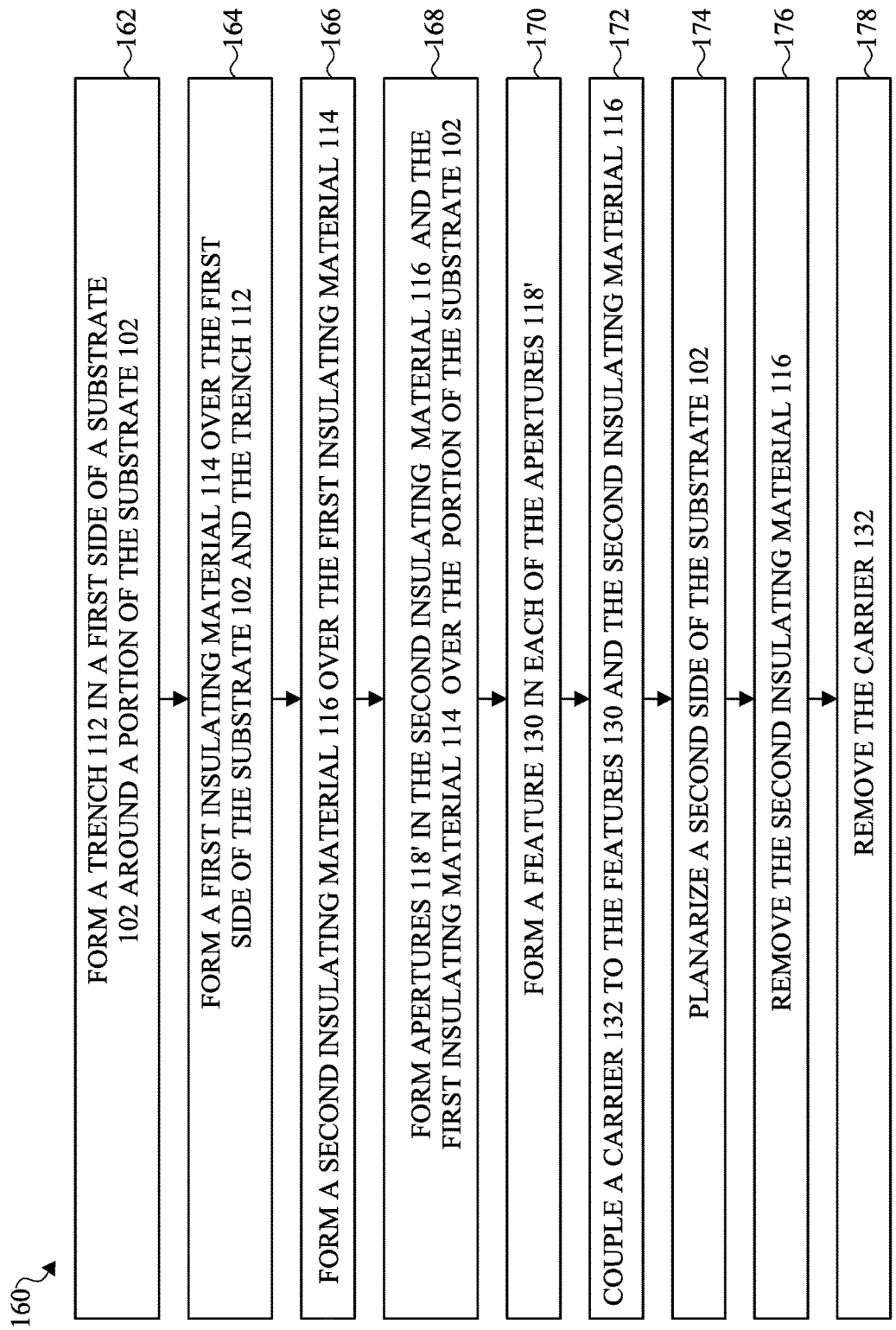
FIG. 30 is a flow chart that illustrates a method of manufacturing a semiconductor device in accordance with some embodiments of the present disclosure.

FIG. 30 is a flow chart 160 that illustrates a method of manufacturing a semiconductor device 100 in accordance with some embodiments of the present disclosure. In step 162, a trench 112 is formed in a first side of a substrate 102 around a portion of the substrate 102 (see also FIGS. 4 through 7). In step 164, a first insulating material 114 is formed over the first side of the substrate 102 and the trench 112 (FIG. 8). In step 166, a second insulating material 116 is formed over the first insulating material 114 (FIG. 9). In step 168, apertures 118' are formed in the second insulating material 116 and the first insulating material 114 over the portion of the substrate 102 (FIGS. 10 through 13). In step 170, a feature 130 is formed in each of the apertures 118' (FIG. 14). In step 172, a carrier 132 is coupled to the features and the second insulating material 116 (FIG. 15). In step 174, a second side of the substrate 102 is planarized (FIGS. 16 through 18). In step 176, the second insulating material 116 is removed (FIG. 19). In step 178, the carrier 132 is removed (FIG. 20).

Some embodiments of the present disclosure include manufacturing methods for semiconductor devices and singulation methods for semiconductor devices. Some embodiments include semiconductor devices manufactured or singulated using the methods described herein.

Advantages of some embodiments of the present disclosure include providing singulation methods that do not require the use of a die saw or laser. The trenches used to define the singulation regions may be made smaller than a width of die saws, for example. Thus, more area on a wafer may be used for active circuit regions, advantageously. The second insulating material comprises multiple material layers to assure that trenches are completely filled with the first insulating material and second insulating material. The first insulating material provides etch selectivity for the removal of the second insulating material. The first insulating material has a good interface quality with material layers the first insulating material is formed on. The first insulating material left remaining on singulated integrated circuit dies functions as a moisture barrier during the etch process for the second insulating material, and later in the finished product. Furthermore, the methods and structures described herein are easily implementable into existing semiconductor manufacturing and singulation process flows and structures.

In some embodiments, a method of manufacturing a semiconductor device includes forming a trench in a substrate, the trench being formed within a first side of the substrate and disposed around a portion of the substrate, and forming a first insulating material over the first side of the substrate and the trench. The method includes forming a second insulating material over the first insulating material, and forming a plurality of apertures in the second insulating material and the first insulating material over the portion of the substrate. A feature is formed in each of the plurality of apertures in the second insulating material and the first insulating material over the portion of the substrate. The method includes coupling a carrier to the features and the second insulating material, and planarizing a second side of the substrate, the second side of the substrate being opposite the first side of the substrate. The second insulating material is removed, and the carrier is removed.

In some embodiments, a method of singulating a semiconductor device includes forming an active circuit region within a first side of a substrate, forming a trench around the active circuit region, and forming a first insulating material over the first side of the substrate and the trench, wherein the first insulating material lines the trench. A second insulating material is formed over the first insulating material, the second insulating material comprising a first layer and a second layer disposed over the first layer. A plurality of apertures is formed in the second insulating material and the first insulating material over the active circuit region, and a contact is formed in each of the plurality of apertures in the second insulating material and the first insulating material over the active circuit region. A carrier is coupled to the second insulating material and the contacts. A second side of the substrate is planarized, the second side of the substrate being opposite the first side of the substrate. The method includes removing the second insulating material, and removing the carrier. Planarizing the second side of the substrate removes the first insulating material disposed over a surface of the second insulating material within the trench. Removing the second insulating material comprises singulating an integrated circuit die comprising the active circuit region.

In some embodiments, a semiconductor device includes active circuitry formed within or over a substrate, and a plurality of contact pads disposed over the active circuitry. A layer of $Al_2O_3$ is disposed over sidewalls and a surface of the active circuitry and a portion of the plurality of contact pads. A contact is disposed over each of the plurality of contact pads, wherein a portion of the contacts is disposed within the layer of $Al_2O_3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, the method comprising:
   forming a trench in a substrate, the trench being formed within a first side of the substrate and disposed around a portion of the substrate;
   forming a first insulating material over the first side of the substrate and the trench;
   forming a second insulating material over the first insulating material;
   forming a plurality of apertures in the second insulating material and the first insulating material over the portion of the substrate;
   forming a feature in each of the plurality of apertures in the second insulating material and the first insulating material over the portion of the substrate;
   coupling a carrier to the features and the second insulating material;
   planarizing a second side of the substrate, the second side of the substrate being opposite the first side of the substrate;
   removing the second insulating material; and
   removing the carrier.
2. The method according to claim 1, wherein forming the first insulating material comprises forming $Al_2O_3$ using atomic layer deposition (ALD).
3. The method according to claim 1, further comprising:
   forming a plurality of trenches in the substrate, each of the plurality of trenches being disposed around a portion of the substrate, the trench being one of the plurality of trenches;

forming the plurality of apertures in the second insulating material and the first insulating material over the portions of the substrate; and forming the feature in each of the plurality of apertures in the second insulating material and the first insulating material over the portions of the substrate.

4. The method according to claim 3, wherein forming the plurality of trenches in the substrate comprises forming the plurality of trenches in singulation regions of the substrate.

5. The method according to claim 4, wherein removing the second insulating material comprises singulating a plurality of integrated circuit dies formed within the substrate.

6. The method according to claim 1, wherein forming the first insulating material comprises lining the trench with the first insulating material, and wherein planarizing the second side of the substrate comprises removing the first insulating material disposed over a surface of the second insulating material within the trench.

7. The method according to claim 1, wherein forming the second insulating material comprises forming a first layer over the first insulating material and forming a second layer over the first layer.

8. The method according to claim 1, wherein forming the feature in each of the plurality of apertures comprises forming features selected from the group consisting essentially of: plugs of a material; segments of a material; contacts; contact pads; and combinations thereof.

9. A method of singulating a semiconductor device, the method comprising:
  forming an active circuit region within a first side of a substrate;
  forming a trench in the substrate around the active circuit region;
  forming a first insulating material over the first side of the substrate and the trench, wherein the first insulating material lines the trench;
  forming a second insulating material over the first insulating material, the second insulating material comprising a first layer and a second layer disposed over the first layer;
  forming a plurality of apertures in the second insulating material and the first insulating material over the active circuit region;
  forming a contact in each of the plurality of apertures in the second insulating material and the first insulating material over the active circuit region;
  coupling a carrier to the second insulating material and the contacts;
  planarizing a second side of the substrate, the second side of the substrate being opposite the first side of the substrate;
  removing the second insulating material; and
  removing the carrier, wherein planarizing the second side of the substrate removes the first insulating material disposed over a surface of the second insulating material within the trench, and wherein removing the second insulating material comprises singulating an integrated circuit die comprising the active circuit region.

10. The method according to claim 9, wherein forming the second insulating material comprises forming the first layer of the second insulating material comprising a high aspect ratio plasma (HARP) oxide.

11. The method according to claim 9, wherein forming the second insulating material comprises forming the second layer of the second insulating material comprising a high density plasma (HDP) oxide.

12. The method according to claim 9, wherein forming the second insulating material comprises forming a second layer comprising a depression over the trench.

13. The method according to claim 12, further comprising planarizing the second layer of the second insulating material to remove the depression.

14. The method according to claim 9, wherein forming the plurality of apertures comprises forming a plurality of first apertures, and wherein forming the second insulating material comprises forming a second aperture in the first layer of the second insulating material within the trench.

15. The method according to claim 9, wherein forming the active circuit region comprises forming an active circuit region having a first depth within the substrate, and wherein forming the trench comprises forming a trench having a second depth within the substrate, the second depth being greater than the first depth.

16. The method according to claim 9, wherein the substrate comprises an interconnect structure disposed over the active circuit region of the substrate, wherein forming the trench around the active circuit region further comprises forming the trench in the interconnect structure, and wherein forming the first insulating material comprises forming the first insulating material over the interconnect structure and over sidewalls of the active circuit region.

17. The method according to claim 16, wherein the interconnect structure comprises a plurality of contact pads disposed proximate a surface thereof, and wherein forming the contact in each of the plurality of apertures comprises forming a contact over each of the plurality of contact pads.

18. A method of singulating a semiconductor device, the method comprising:
  forming an active circuit region within a first side of a substrate;
  forming a trench in the substrate around the active circuit region;
  forming a first insulating material over the first side of the substrate and the trench, wherein the first insulating material lines the trench;
  forming a second insulating material over the first insulating material;
  forming a plurality of apertures in the second insulating material and the first insulating material over the active circuit region;
  forming a contact in each of the plurality of apertures in the second insulating material and the first insulating material over the active circuit region;
  planarizing a second side of the substrate opposite the first side of the substrate, wherein planarizing the second side of the substrate removes the first insulating material disposed over a surface of the second insulating material within the trench; and
  removing the second insulating material, wherein removing the second insulating material comprises singulating an integrated circuit die comprising the active circuit region.

19. The method of claim 18, wherein the first insulating material comprises $Al_2O_3$, and wherein the second insulating material comprises a high aspect ratio plasma (HARP) oxide, a high density plasma (HDP) oxide, or a combination thereof.

20. The method of claim 18 further comprising attaching a carrier to the first side of the substrate opposite the first side of the substrate while planarizing the first side of the substrate and removing the carrier after removing the second insulating material.

* * * * *